(12) United States Patent
Miani et al.

(10) Patent No.: US 12,710,444 B2
(45) Date of Patent: Aug. 18, 2026

(54) FORCE SENSOR WITH AN INCREASED OPERATING RANGE

(71) Applicant: COMMISSARIAT A L'ENERGIE ATOMIQUE ET AUX ENERGIES ALTERNATIVES, Paris (FR)

(72) Inventors: Theo Miani, Grenoble Cedex 09 (FR); Loic Joet, Grenoble Cedex 09 (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 337 days.

(21) Appl. No.: 18/690,135

(22) PCT Filed: Sep. 6, 2022

(86) PCT No.: PCT/FR2022/051679
§ 371 (c)(1),
(2) Date: Mar. 7, 2024

(87) PCT Pub. No.: WO2023/037070
PCT Pub. Date: Mar. 16, 2023

(65) Prior Publication Data

US 2024/0377431 A1 Nov. 14, 2024

(30) Foreign Application Priority Data

Sep. 9, 2021 (FR) ....................................... 2109457

(51) Int. Cl.
*G01P 15/097* (2006.01)
*B81B 3/00* (2006.01)
(Continued)

(52) U.S. Cl.
CPC .......... *G01P 15/097* (2013.01); *B81B 3/0059* (2013.01); *G01P 15/0922* (2013.01);
(Continued)

(58) Field of Classification Search
CPC .. G01P 15/097; G01P 15/0922; G01P 15/125; G01P 2015/0814;
(Continued)

(56) References Cited

U.S. PATENT DOCUMENTS

2013/0170517 A1* 7/2013 Duraffourg ............... G01J 5/28 438/54
2015/0022431 A1* 1/2015 Mahameed ........... G06F 1/1694 310/300
2018/0327253 A1* 11/2018 Jourdan ............... G02B 6/3584

FOREIGN PATENT DOCUMENTS

CN 110780089 A 2/2020
FR 2941534 A1 * 7/2010 ........... G01R 33/038
(Continued)

OTHER PUBLICATIONS

FR-2941534-A1, English Translation (Year: 2010).*
(Continued)

*Primary Examiner* — Ryan D Walsh
(74) *Attorney, Agent, or Firm* — Oblon, McClelland, Maier & Neustadt, L.L.P.

(57) ABSTRACT

A microelectromechanical accelerometer includes a support, at least one mass suspended by suspension means relative to the support and configured to move in the plane of the accelerometer, means for measuring the displacement of the seismic mass including at least one first vibrating beam of nanometric cross-section, and first electrostatic coupling means between the seismic mass and said at least one first vibrating beam configured to ensure a mechanical decoupling between the first vibrating beam and the seismic mass. At rest, the first electrostatic coupling means generates traction on the first vibrating beam, so that under the effect of acceleration the state of strain of the first vibrating beam is modified.

15 Claims, 5 Drawing Sheets

(51) Int. Cl.
*G01P 15/08* (2006.01)
*G01P 15/09* (2006.01)
*G01P 15/125* (2006.01)
*G01V 7/00* (2006.01)

(52) U.S. Cl.
CPC .............. *G01P 15/125* (2013.01); *G01V 7/00* (2013.01); *B81B 2201/0235* (2013.01); *B81B 2203/01* (2013.01); *G01P 2015/0814* (2013.01); *G01P 2015/0817* (2013.01)

(58) Field of Classification Search
CPC ........... G01P 2015/0817; B81B 3/0059; B81B 2201/0235; B81B 2203/01; G01V 7/00
See application file for complete search history.

(56) References Cited

FOREIGN PATENT DOCUMENTS

| | | | | |
|---|---|---|---|---|
| FR | 2957414 A1 * | 9/2011 | ............ | G01P 15/123 |
| JP | 2009002953 A * | 1/2009 | .......... | G01P 15/0802 |

OTHER PUBLICATIONS

FR-2957414-A1, English Translation (Year: 2011).*
JP-2009002953-A, English Translation (Year: 2009).*
International Search Report issued Jan. 10, 2023 in PCT/FR2022/051679, filed on Sep. 6, 2022, 3 pages.
Bruno Barazani et al. "Microfabricated Neuroaccelerometer: Integrating Sensing and Reservoir Computing in MEMS" arxiy.org, Cornell University Library, 201 Olin Library Cornell University Ithaca, NY 14853, Mar. 24, 2020 XP081627798, 11 pages.
Xiong Xingyin et al. "Using Electrostatic Spring Softening Effect to Enhance Sensitivity of MEMS Resonant Accelerometers" IEEE Sensors Journal, IEEE, USA, vol. 21, No. 5, Nov. 16, 2020 (Nov. 16, 2020), XP011835841 pp. 5819-5827.
Wu Wenjie et al. "Measurement of Tidal Tilt by a Micromechanical Inertial Sensor Employing Quasi-Zero—Stiffness Mechanism" Journal of Microelectromechanical Systems, IEEE Service Center, US, vol. 29, No. 5, Oct. 1, 2020 (Oct. 1, 2020), XP011813317, pp. 1322-1331.

* cited by examiner

FORCE SENSOR WITH AN INCREASED OPERATING RANGE

TECHNICAL FIELD AND PRIOR ART

The present invention relates to a force sensor with an increased operating range, and in particular to a resonant microelectromechanical accelerometer with an increased operating range.

A force sensor converts the displacement of a test body to a force that is transmitted. In the case of a resonant force sensor, the force is transmitted to a resonant beam, the test body being set in motion by acceleration, a magnetic field or pressure, for example.

A resonant accelerometer is an example of a resonant force sensor including a mass suspended from a support and movable in the plane or in an out-of-plane direction under the effect of acceleration and at least one resonator suspended between the support and the mass. The resonator is formed for example by a vibrating beam, i.e. a beam vibrated at its resonant frequency by electrodes. When the mass is moved due to the effect of acceleration, the beam which is mechanically connected to the mass is compressed or stretched which changes its resonant frequency. The variation in its resonant frequency is detected, which enables the value of the acceleration to be determined. The resonant beam is used as a force sensor.

Accelerometers manufactured using MEMS & NEMS (microelectromechanical systems & nanoelectromechanical systems) technology have a mass of micrometric dimensions, i.e. a footprint of several 100 μm on each side to several mm on each side, for example formed by a square of 1000 μm. The thickness of the mass can be up to 700 μm for example, due to the thickness of the substrate, and one or more resonant beams or resonators of nanometric dimensions, known as nanoresonators. The nanoresonators are beams which can have the following dimensions: a length of several μm to several tens of μm and a nanometric cross-section of several tens of nm to 1 μm on each side.

By miniaturising the beams in relation to the mass, it is possible to achieve a much greater sensitivity to acceleration than that achieved by accelerometers that have a seismic mass and beams of micrometric size.

Furthermore, the dynamic range of a resonator used as a force transducer is limited by the maximum permissible stresses of the vibrating beam. Under compression, this stress is limited by buckling. Under tension, the rupture of the beam material is the limiting phenomenon. In the case of nanometric resonators, these limits determine the maximum operating range of the sensor.

For example, in the case of a silicon beam, the buckling of a nanometric resonator, with a cross-section of 250 $nm^2$ and a length of 10 μm, is achieved at a compressive stress of 300 MPa, whereas stress rupture occurs with a tensile force greater than 1 GPa. Consequently, the buckling phenomenon limits the operating range.

However, the nanometric layer in which the beam is formed is generally subjected to an internal compressive stress which can be in the order of 150 MPa, this internal stress appears during manufacture. The operating range is then reduced to ±150 MPa, the measurement range being symmetrical, or even less, to maintain a "safety" margin against buckling.

The same phenomenon can occur in the case of a force sensor using one or more piezoresistive gauges.

Consequently, the operating range of MEMS & NEMS accelerometers is significantly reduced.

DISCLOSURE OF THE INVENTION

It is therefore an aim of the present invention to provide a force sensor with an extended operating range compared to the force sensors of the prior art.

The aforementioned aim is achieved by a resonant force sensor including a test body of micrometric size and a strain gauge of micrometric size which are at least separated mechanically, and electrostatic coupling means between the mass and the strain gauge which, on the one hand, apply in the rest state a stretching stress induced by an initial electrostatic force, which makes it possible at least to cancel all or a portion of the internal stress on the strain gauge. On the other hand, these means make it possible, when the test body is moved, to apply a compressive or stretching stress to the strain gauge while having a mechanically separated test body and strain gauge.

The mechanical separation allows some of the internal stresses in the strain gauge to be relaxed. The application of a stretching stress, due to the electrostatic coupling means, cancels out another portion of the internal stresses. Thus the operating range is then extended, preferably by at least the value of the internal relaxed stresses.

The strain gauge can be a resonator formed by a nanometric vibrating beam or a nanometric piezoresistive gauge.

Advantageously, the stretching stress can be such that the beam is under tension, which further increases the operating range.

In one embodiment, the force sensor has a carriage of low mass relative to that of the test body, which transmits the stress to the strain gauge via a lever arm. The electrostatic coupling means may include interdigitated combs.

It is also an aim of the present invention to provide a force sensor that has increased sensitivity. To achieve this, the force sensor has two differential strain gauges, the electrostatic forces are applied in a balanced manner to the test body, cancelling out the electrostatic forces at rest and thus resisting "pull-in" or risk of "collapse". It is then possible to apply a higher electrical voltage and/or reduce air gaps, and thus increase the sensitivity of the sensor.

In other words, a force sensor is produced, in which the displacement of the test body is transmitted to a strain gauge by an electrostatic coupling, which makes it possible to mechanically decouple the test body from the beam and release some of the internal stresses from the strain gauge, and which also makes it possible to apply a permanent tensile stress to the strain gauge, advantageously at least by the value of the portion of the internal stresses not released by mechanical decoupling. The electrostatic coupling enables a variable tension/compression to be transmitted to the strain gauge as a function of the displacement of the test body.

The term "mechanical decoupling" means that there is no direct mechanical connection between the test body and the strain gauge, the test body and the beam suspended on the sensor support.

One of the subject-matters of the present application is a force sensor including a support, at least one test body which is suspended by suspension means relative to the support and is capable of moving in the plane of the accelerometer, means for measuring the displacement of the test body including at least one first strain gauge of nanometric cross-section and the first electrostatic coupling means between the test body and said at least one first strain gauge configured to ensure a mechanical decoupling between said first strain gauge and the test body, so that at rest said first electrostatic coupling means generate traction on the first strain gauge, and so that under the effect of an external force they modify the state of the strain of the first strain gauge.

Preferably, the force sensor includes a second strain gauge of nanometric cross-section differentially mounted with respect to the first strain gauge, and second electrostatic coupling means between the test body and said second strain gauge configured to ensure a mechanical decoupling between said second strain gauge and the test body, so that at rest said second electrostatic coupling means generate traction on the second strain gauge, and so that under the effect of acceleration they modify the state of strain of the second strain gauge.

The first strain gauge with a nanometric cross-section is advantageously provided with a vibrating beam. This vibrating beam is typically suspended from a suspension beam.

The suspension beam does not have a detection function and is not set to vibrate around its resonant frequency.

The vibrating beam typically has a smaller cross-section than the suspension beam.

In particular, the suspension beam has a cross-section that is at least 10 times, preferably 100 times greater, and more advantageously 1000 times greater than that of the vibrating beam.

The suspension beam in turn has a micrometric cross-section of between 1 μm and several hundred micrometres.

The suspension beam makes it possible to release the internal stresses resulting from the manufacture of the layer in which the vibrating beam is etched. It therefore helps to extend the operating range.

The first and/or second electrostatic coupling means may be configured to generate at rest an electrostatic force so as to at least cancel the residual stresses in the first strain gauge and/or the second strain gauge.

In one embodiment, the first and/or second electrostatic coupling means each include at least one first and one second opposing electrode, the first electrode being constrained to move with the seismic mass and the second electrode being fixed to a longitudinal end of the first and/or the second strain gauge.

The first strain gauge and/or the second strain gauge may each be connected to a second electrode by a lever arm articulated in rotation in the plane of the sensor.

The first and/or second electrostatic coupling means each include for example at least one pair of interdigitated combs provided with fingers, one comb being integral in movement with the test body and the other being fixed to the lever arm.

The test body and the suspension means of the test body can be configured so that the test body moves in translation in the plane along a given direction.

According to an additional feature, the first and/or the second electrostatic coupling means include at least one carriage bearing at least one comb and connected mechanically to the lever arm. Preferably, the carriage has a reduced mass compared to that of the test body, the mass of the carriage being at least 10 times lower than the mass of the test body.

For example, the carriage includes an outer frame delimited by uprights from which fingers of the comb project, and the at least one comb integral in movement with the test body is arranged inside the frame and its fingers are placed between the fingers of the comb of the carriage.

Advantageously, the force sensor includes several pairs of interdigitated combs so as to provide a large electrostatic coupling surface.

For example, the first and/or second coupling means include two carriages each connected to the first strain gauge by a lever arm and a transmission connected to the two lever arms.

According to another example, the first and/or the second strain gauge is and/or are suspended by a longitudinal end from a first side face of a suspension beam deformable by bending in the given direction (X), and a second face of the suspension beam opposite the first face faces an edge of the test body forming therewith the first and/or second electrostatic coupling means.

According to another example, the force sensor includes a pivot joint by which the mass is suspended from the support and by means of which the mass is rotatable in the plane of the force sensor, and the first and/or second coupling means are formed by a side face of the lever arm and an edge facing the test body.

Very advantageously, said at least one strain gauge is a vibrating beam resonator.

Another subject-matter of the present application is an accelerometer including a force sensor according to the invention, wherein the test body is a seismic mass.

Another subject-matter of the present application is a gravimeter including at least one accelerometer according to the invention and the suspension means of the seismic mass are configured to flare when the seismic mass is subjected to 1 g of the Earth's acceleration.

BRIEF DESCRIPTION OF THE DRAWINGS

The present invention will be better understood on the basis of the following description and the appended drawings wherein.

DETAILED DISCLOSURE OF PARTICULAR EMBODIMENTS

The force sensor according to the invention is described in more detail with regard to its application as a microelectromechanical accelerometer, but it can be used in other applications as described below.

Figures 1A, 1B, 2:
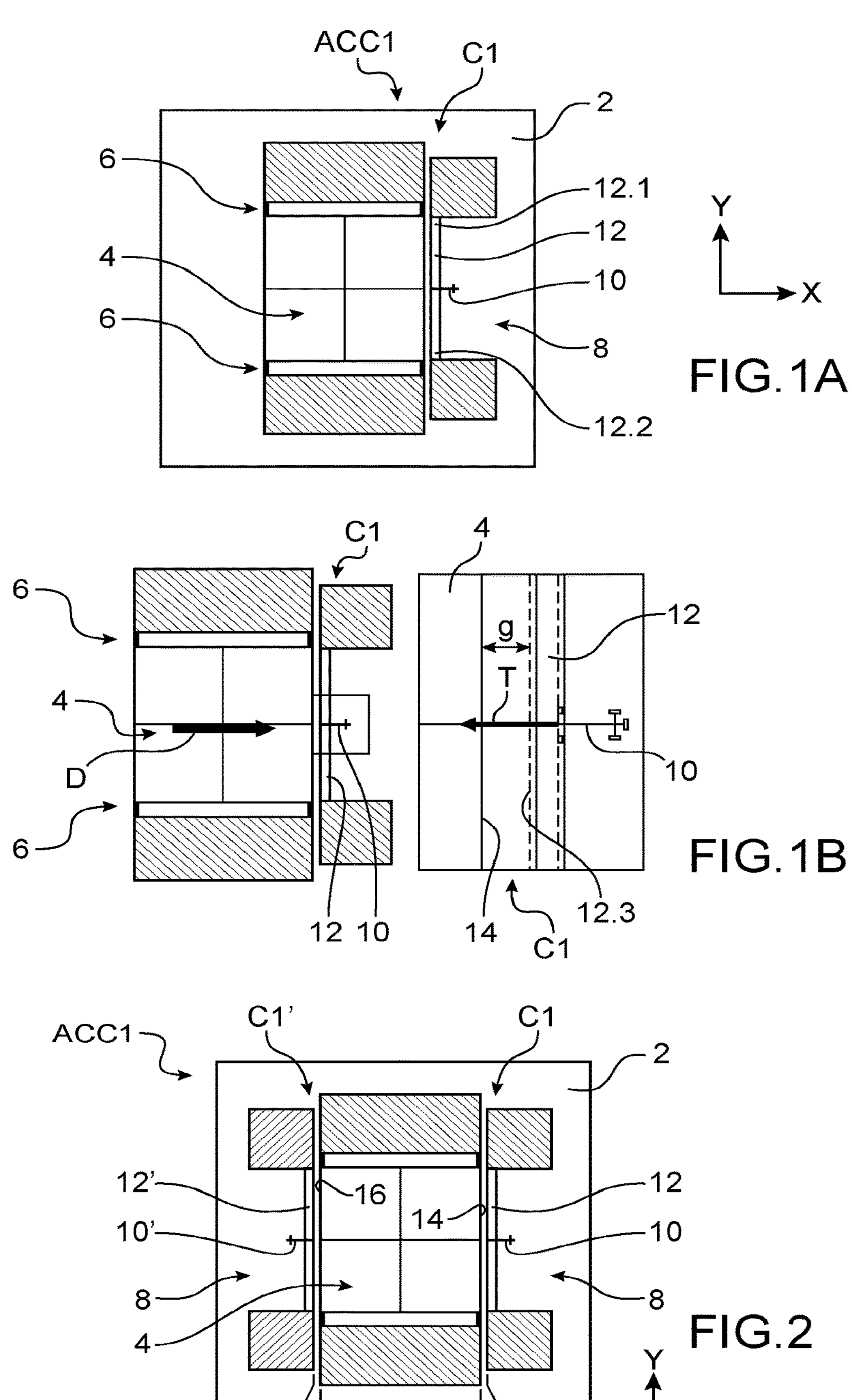
FIG. 1A is a schematic representation of an example of an accelerometer according to the invention according to a first embodiment.
FIG. 1B is a representation of the accelerometer of FIG. 1A when an electrostatic force is generated in an enlarged view.
FIG. 2 is a schematic representation of another example of an accelerometer according to the invention according to a first embodiment.

FIGS. 1A and 1B show an embodiment of an ACC1 microelectromechanical accelerometer according to a first embodiment.

In the present application a "microelectromechanical accelerometer" is a microelectromechanical and nanoelectromechanical accelerometer including one part, in particular the seismic mass of micrometric dimensions and another part, in particular measuring means, of nanometric dimensions.

The ACC1 accelerometer includes a support 2, which is generally referred to as a substrate in microelectronics, a seismic mass 4 suspended from the support 2 by suspension means 6. The suspension means 6 are such that the seismic mass 4 is able to move in the XY plane of the accelerometer along direction X from the effect of an acceleration.

The plane of the accelerometer is a plane parallel to the support.

In the example shown, the suspension means 6 include beams extending perpendicular to the direction X in the plane of the accelerometer and configured to bend in direction X. In this example, the seismic mass 4 is square in form and there are four beams, parallel to one another and connecting a vertex of the mass 4 to the support 2. Other suspension means and other arrangements are possible. For example, the beams can be folded to reduce the stiffness in direction X, thereby limiting the buckling of the suspension elements. More than at least four suspension elements are possible, for example six suspension elements can be used. Preferably, the suspension means are symmetrical to reject parasitic movements as far as possible, in particular the rotation of the mass in the plane.

Furthermore, the shape of the mass is not limiting.

In this example, the accelerometer also includes measuring means 8 for the displacement of the seismic mass comprising a vibrating beam 10. A vibrating beam or resonant beam is set to vibrate at its resonant frequency by one or more actuating electrodes, any tensile or compressive stress experienced by the beam is reflected by a variation in its resonant frequency, this variation making it possible to deduce the stress experienced. The suspension of the vibrating beam is such that the beam is able to vibrate. The vibrating beam 10 is parallel to the direction X and is suspended by a longitudinal end from the support 2 and by another longitudinal end from a suspension beam 12 which is perpendicular to the direction X, the suspension beam 12 being anchored to the support at its ends 12.1, 12.2. The suspension beam 12 is capable of flexurally bending in direction X. The vibrating beam 10 can be anchored directly to a stud. The measuring means then comprise capacitive detection means. Preferably, the detection electrode is separate from the actuation electrode. In another example, the detection means are of the piezoresistive type and the end of the vibrating beam 10 is connected to a stud via a piezoresistive gauge.

The accelerometer is a MEMS & NEMS (microelectromechanical systems & nanoelectromechanical systems) system. The accelerometer has a mass of micrometric size, i.e. with footprint of several 100 μm on each side to several mm on each side, for example formed by a square of 1000 μm. The thickness of the mass may be up to 700 μm for example, due to the thickness of the substrate, and nanometric measuring means, i.e. the vibrating beam may have the following dimensions: a length of several μm to several tens of μm and a nanometric cross-section of several tens of nm to 1 μm on each side, for example 250 nm.

The ACC1 accelerometer is manufactured using microelectronic technologies by layer deposition and etching, the vibrating beam 10 is etched into a layer with a thickness of several tens to several hundreds of nanometres. This layer is subjected to an internal compressive stress, for example of in the order of 150 MPa.

In the ACC1 accelerometer of FIGS. 1A and 1B the suspension beam 12, from which the vibrating beam 10 is suspended, is free to deform in direction X which is the longitudinal direction of the vibrating beam 10, the internal stresses resulting from the manufacture of the layer in which the vibrating beam 10 is etched are partially relaxed.

The ACC1 accelerometer also includes first electrostatic means C1 providing a coupling between the seismic mass 4 and the vibrating beam 10.

The first coupling means C1 include a capacitor with variable capacitance formed by a side 14 of the seismic mass 2 and by a side face 12.3 of the suspension beam 12. The side 14 and the side face 12.3 face one another and are separated by an air gap g, they form the plates of the capacitor with a variable capacitance.

By applying a potential difference between the seismic mass 2 and the suspension beam 12, an electrostatic force is generated between the side 14 and the side face 12.3, which ensures a coupling between the seismic mass 4 and the vibrating beam.

This coupling results in:

at rest; on the one hand, due to the fact that there is an attraction between the mass and the suspension beam 12 which deforms the suspension beam 12 by bending in the direction of the seismic mass 4 and reduces the air gap between the mass and the suspension beam 12, exerting a tensile force on the vibrating beam 10. This tensile force cancels out at least some of the remaining internal stresses in the vibrating beam 10. The potential difference is preferably selected to at least completely cancel the internal stresses.

in a state under acceleration on the other hand, by the fact that a displacement of the seismic mass in the direction X, from the effect of an acceleration along this axis, deforms the suspension beam 12 by bending and applies a tensile or stretching stress to the vibrating beam 10. It is possible to measure the acceleration via the stress applied to the vibrating beam 10. As the electrostatic force is inversely proportional to the square of the value of the air gap, when the mass is displaced towards the suspension beam 12 from the effect of acceleration, the value of the air gap is reduced and the tensile force applied to the vibrating beam increases. In FIG. 1B, the displacement of the seismic mass 4 is symbolised by the arrow D. The beams of the suspension means are depicted which are deformed. In FIG. 1B, the arrow T symbolises the tensile force exerted on the vibrating beam 10 at its end connected to the suspension beam 12, by the electrostatic force.

By cancelling the internal stresses in the vibrating beam 10, the operating limit in compression is shifted by the value of the internal stressed, for example 150 MPa. For a beam with a cross-section of 250 $nm^2$ and a length of 10 μm, the buckling limit is 300 MPa. Instead of being reduced to +/−50 MPa due to internal stresses, the operating range extends to +/−200 MPa if all internal stresses are relaxed.

In one operating mode, it is possible to select the application of a potential difference between the mass and the suspension beam 12 such that the tensile stress seen by the vibrating beam 10 is greater than the internal stresses to be relaxed. This further increases the operating range. It should be noted that the theoretical tensile strength break for silicon is greater than 1 GPa, the level of the tensile stress applicable to the beam is therefore high.

The ACC1 accelerometer functions as follows.

At rest, a potential difference between the mass 4 and the suspension beam 12 makes it possible to relax all of part of the internal stresses in the vibrating beam.

When the seismic mass 4 moves in direction X from the effect of acceleration, due to the electrostatic coupling between the mass and the suspension beam 12, the displacement of the seismic mass applies to the vibrating beam 10. The vibrating beam 10 is also vibrated at its resonant frequency. This traction has the effect of varying the resonant frequency of the beam. A processing unit to which the accelerometer is connected measures the variation in resonant frequency, determines the displacement of the mass and calculates the acceleration it has experienced.

FIG. 2 shows another embodiment of an ACC2 accelerometer according to the first embodiment.

The ACC2 accelerometer differs from the ACC1 accelerometer in that it includes a second vibrating beam 10' mounted differentially with the vibrating beam 10.

The vibrating beam 10' is arranged opposite the vibrating beam 10 with respect to the seismic mass. The vibrating beam 10' extends in the direction X and is suspended at one end by a longitudinal end from the support 2 and is suspended at another longitudinal end from a suspension beam 12' extending perpendicular to the direction X and capable of flexural deformation. The suspension beam 12' is anchored to the support by its two longitudinal ends.

The suspension beam 12' extends parallel to an edge 16 of the mass 4 parallel to the edge 14. Together with the lateral edge of the suspension beam 12', the edge 16 forms a capacitor with a variable capacitance of air gap g', forming the second electrostatic coupling means C1' providing a coupling between the seismic mass 2 and the vibrating beam 10'. As with the vibrating beam 10, the connection of one of the ends of the vibrating beam 10' to the suspension beam 12' makes it possible to allow some of the internal stresses in the beam 10' to be relaxed.

Furthermore, the application of a potential difference between the mass and the vibrating beam 10' generates electrostatic forces exerting a tensile force on the vibrating beam 10' and therefore the at least partial, and preferably total, cancellation of the internal stresses.

The use of a differential assembly and two coupling means C1, C1' makes it possible very advantageously to increase the sensitivity of the accelerometer, which is inversely proportional to the cube of the width of the air gaps and proportional to the square of the polarisation voltage. Since the electrostatic forces are applied to the opposite faces 14 and 16 of the mass 4, the mass 4 is held in equilibrium between the two suspension beams 12, 12'. It is then possible to increase the electrostatic forces between the mass 4 and beams 12 and 12' by increasing the applied potential difference, and thus reduce the width of the air gaps while limiting the risk of adhesion between the mass and the beams. Air gaps of reduced width and higher voltage allow high sensitivity to be achieved.

The operation of the ACC2 accelerometer is as follows:

The movement of the seismic mass under the effect of the acceleration causes the air gaps g and g' to vary differentially. For example, when the mass 4 moves towards the vibrating beam 10, the width of the air gap g decreases, the electrostatic force applied increases, which amplifies the tensile stress on the vibrating beam 10; the width of the air gap g' increases, reducing the electrostatic force and reducing the tensile stress on the vibrating beam 10'.

These variations in tensile stress cause the resonant frequencies of each of the vibrating beams 10, 10' to vary, which makes it possible to determine the acceleration experienced by the mass.

Figure 3A:
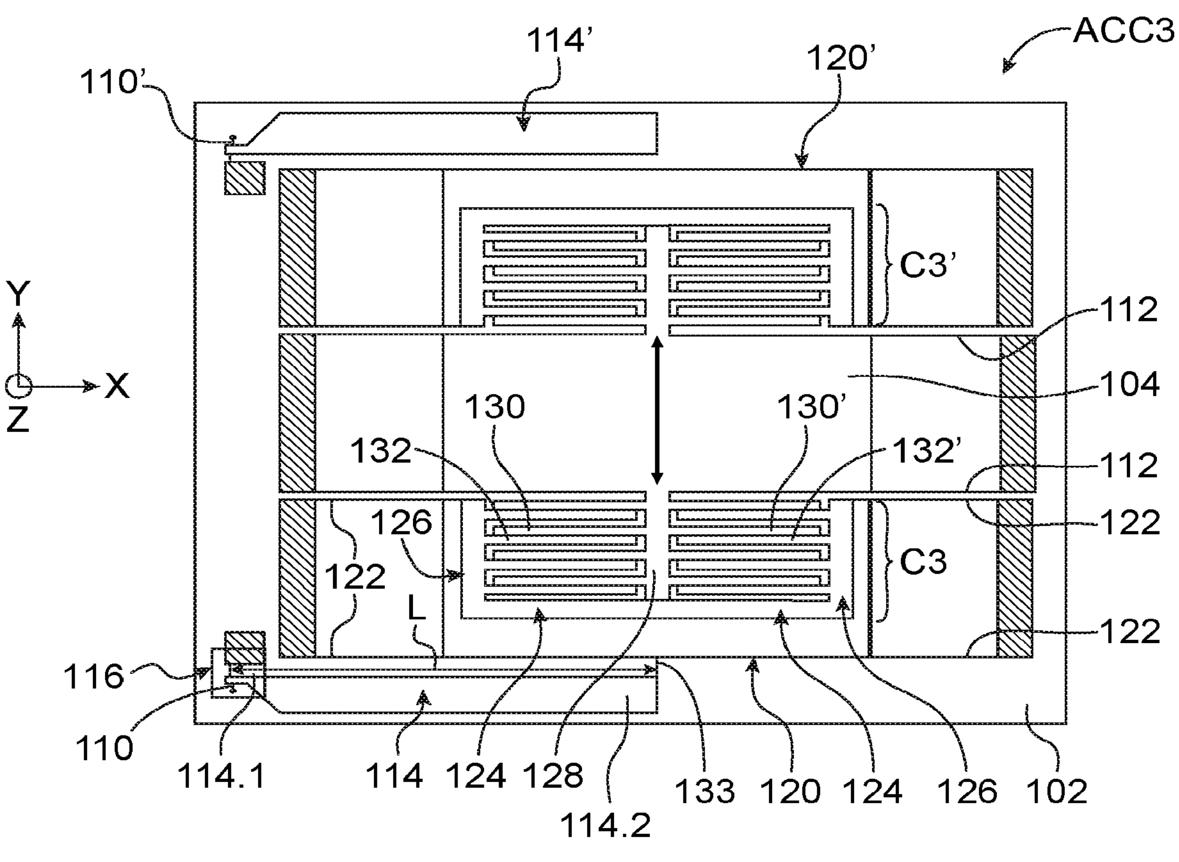
FIG. 3A is a schematic representation of an example of an accelerometer according to the invention according to a second embodiment.
Figure 3B:
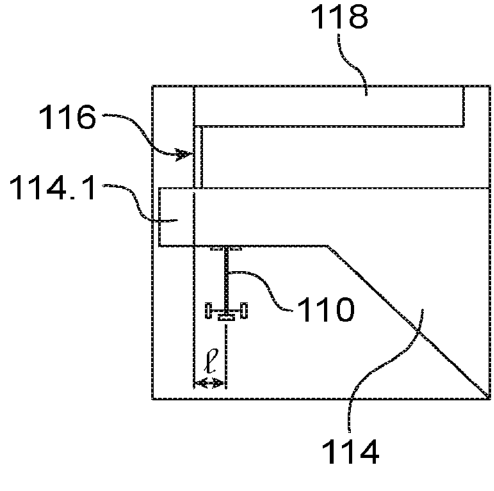
FIG. 3B is an enlarged view of FIG. 3A.

FIGS. 3A and 3B show an embodiment of an ACC3 accelerometer as a second embodiment.

The ACC3 accelerometer differs from the ACC1 and ACC2 accelerometers, in particular in that it uses lever arms.

The accelerometer ACC3 includes a support 102, a seismic mass 104 suspended from the support 102 by suspension means 112. In the example shown, the beams can be deformed by bending and guide the seismic mass in translation in direction Y, similar to those of the ACC1 and ACC2 accelerometers. In this example the seismic mass 104 is rectangular in shape and two beams 112 extend from each side of the mass parallel to the direction X.

The ACC3 accelerometer includes means for measuring the displacement of the mass including two differential vibrating beams 110, 110' and electrostatic coupling means C3, C3' between the measuring means and the mass 104.

Each vibrating beam 110, 110' is suspended at one end from the support 102 and is suspended at another end from a rigid beam 114, 114' of the coupling means C3, C3', said rigid beam 114, 114' being articulated in rotation relative to the support 102 about an axis orthogonal Z to the plane of the accelerometer. The rigid beams form lever arms.

The coupling means are similar or identical, only the coupling means C3 are described in detail.

A pivot joint 116 is provided between a longitudinal end 114.1 of the rigid beam 114 and the support 102. As shown in detail in FIG. 3B, in this example the pivot joint 116 is formed by a flexurally deformable beam, connecting the end 114.1 of the beam to an anchoring stud 118.

The vibrating beam 110 is suspended from the rigid beam 114 at a distance I from the pivot link 116 along the beam 114. The lever arm 114 has a length L. The vibrating beam 110 is located so that, at rest from the action of the coupling means C3, the vibrating beam 110 is subjected to a tensile force. In this example, the vibrating beam 110 is located opposite the pivot link with respect to the beam 114.

The electrostatic coupling means C3 also includes a carriage 120 suspended from the support 102 and guided in translation in the X direction. In the example shown, the suspension means formed by beams 122, which are deformable by bending, ensure that the carriage 120 is guided in translation in direction X. In the example shown, the carriage 120 has a rectangular external shape and two beams 122 extend from two opposite sides of the carriage parallel to the direction X. The carriage is connected to the end 114.2 of the lever arm 114, which is opposite the end 114.1 articulated to the support.

The electrostatic coupling means include two pairs of interdigitated combs 124, 124', 126, 126'; a pair of combs 124, 124' is connected to the seismic mass 104 and the other pair of combs 126, 126' is connected to the carriage 120. The combs are oriented such that when the electrostatic forces are generated between the combs, displacement in the X direction is generated between the mass 104 and the carriage 120.

In the example shown, an arm 128 extends along the direction Y from an edge of the mass perpendicular to the X direction, and bears the fingers 130 extending in direction X on either side of the arm 128. These fingers define the combs 124, 124' on either side of the arm 128.

The combs 126, 126' are integrated into the carriage and are located inside the carriage. The carriage has an outer frame and the fingers 132, 132' extend from the edges of the frame parallel to the direction Y defining a comb 126, 126' on each edge of the frame. The fingers 130, 130' of the combs 124, 124' are located between the fingers 132, 132'. Variable air gaps in direction Y are delimited between a face of a finger 130 and an opposite face of a finger 132. The carriage is connected to the other end 114.2 of the rigid beam 114 by a beam 133 having a rigidity in direction Y while allowing cohabitation between a translation of the carriage and a rotation of the lever arm.

In this example, the distances between fingers 130, 132 and between fingers 130', 132' are such that they are minimal so that the electrostatic forces cause a positive displacement of the carriage 120 in direction Y and a negative displacement of the carriage 120' in direction Y. The mass 104 being balanced by the two electrostatic steps.

The position of the vibrating beam 110 relative to the pivot 116 determines whether the movement of the carriage induces an elongation or compression of the beam 110. In the example, the force (in the positive direction of Y) generated by the carriage 120 induces an elongation of the beam 110.

The coupling means C3' include a second carriage 120' forming with a second comb integral with the seismic mass, second electrostatic coupling means between the mass and the vibrating beam 110'.

The carriages are rigid and preferably have a very low mass compared to that of the seismic mass, for example the ratio between the mass of a carriage and that of the seismic mass is in the order of 1/10, preferably 1/20. The integration of the combs within the contour of the carriages makes it possible to achieve a high degree of compactness, but also to reduce the mass of the carriages.

The use of interdigitated combs makes it possible to obtain a large coupling surface between the seismic mass and each carriage, which increases the electrostatic sensitivity, i.e. the sensitivity between the movement of the mass and the electrostatic force generated. This sensitivity is proportional to the capacity of the coupling, i.e. its surface area.

The electrostatic force attracting the two electrodes of a capacitor is as follows:

$$\text{Force} = \frac{1}{2}\frac{C}{g}V_{pol}^2$$

where C is the capacitance and g is the distance between the facing surfaces.

The capacitance is given by the facing surfaces S, the permittivity co and the air gap g:

$$C = \varepsilon_0 \frac{S}{g}$$

The arrangement of the interdigitated combs is not limiting, for example the arm 128 bearing the combs could be supported by the carriage and the mass would include combs arranged on either side of the shaft. Furthermore, the number of fingers of the combs is also not limiting.

Some of the internal stresses in the vibrating beams are relieved by the mobility of the lever arm 114, 114' and carriage 120, 120' relative to the seismic mass.

Furthermore, by applying a potential difference between the seismic mass and the carriages, an electrostatic force is generated between the fingers of the interdigitated combs, the carriages are attracted towards the seismic mass, which causes the lever arms 114 to pivot, which apply a tensile force to the vibrating beams, which makes it possible to cancel all or a portion of the unrelaxed internal stresses, or to position the vibrating beams so that they are always in a stretched position during the measurements.

Alternatively, the air gaps between the fingers of the mass and the carriages 120 and 120' are arranged such that the carriage 120 is moved negatively in direction Y and the carriage 120' moves positively in direction Y. The positioning of the vibrating beams is selected relative to the lever such that they are still subject to tensile stress.

The functioning of the ACC3 accelerometer will now be described.

The seismic mass moves in direction Y from the effect of acceleration, which causes the air gaps between the combs supported by the mass 104 and those supported by the carriages 120, 120' to vary differentially. For example, a reduction in the width of the air gaps with the carriage 120 increases the electrostatic force applied and amplifies the tensile stress on the vibrating beam 110, and an increase in the width of the air gaps with the carriage 120' reduces the electrostatic force and reduces the tensile stress on the other vibrating beam 110'.

These variations in tensile stress cause the resonant frequencies of each of the vibrating beams 110, 110' to vary which makes it possible to trace the displacement of the mass and the acceleration at the origin of this displacement. According to the tensile stress applied to the vibrating beams in the resting state, one of the beams enters into a state of compression or remains under stress, but under reduced stress.

The buckling stress is no longer limiting due to the application of the electrostatic force at rest. It is the maximum displacement of the mass before instability which limits the dynamic range. However, the stress in the vibrating beam equivalent to the displacement of the mass is greater than the buckling stress in a resonant accelerometer of the prior art, resulting in an increase in the dynamic range.

An accelerometer similar to the ACC3 accelerometer including only a vibrating beam and only a carriage does not fall within the scope of the present invention.

FIGS. 4A to 4E show an example of an ACC4 accelerometer according to the second embodiment.

In a similar manner to the ACC3 accelerometer, the ACC4 accelerometer uses carriages and interdigitated combs forming the electrostatic coupling means.

In this example, the mass 204 is suspended by suspension means 206 formed by a leaf that is deformable by bending in the XY plane and folded on itself, also known as a "folding" spring. These suspension means also ensure the guiding of the mass in direction X.

The measuring means include two differential vibrating beams 210, 210'.

The electrostatic coupling means C4, C4' are similar for the two vibrating beams, only the coupling means C4 coupling the vibrating beam 210 to the mass 204 will be described in detail.

The coupling means C4 include two carriages 220, 220', each carriage is suspended from the support 202 and guided in translation in direction X by suspension means 212 similar to the suspension means of the mass. In the example shown, four springs are used.

Figure 4A:
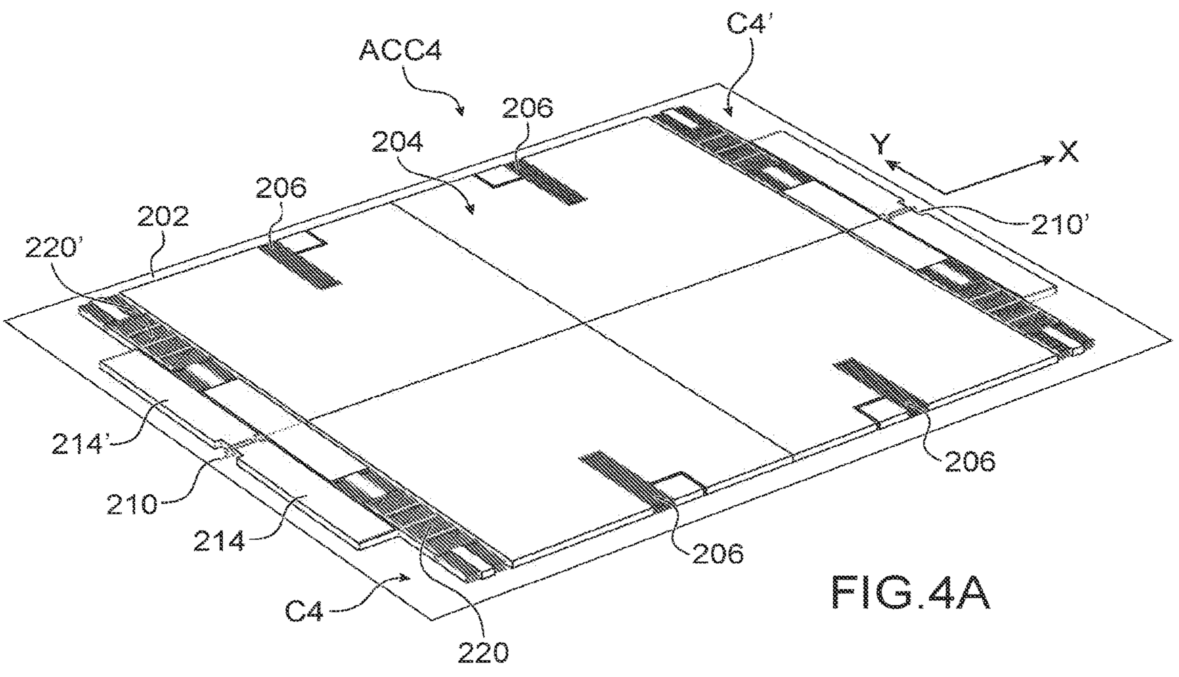
FIG. 4A is a schematic representation of another example of an accelerometer according to the invention according to the second embodiment.
Figure 4B:
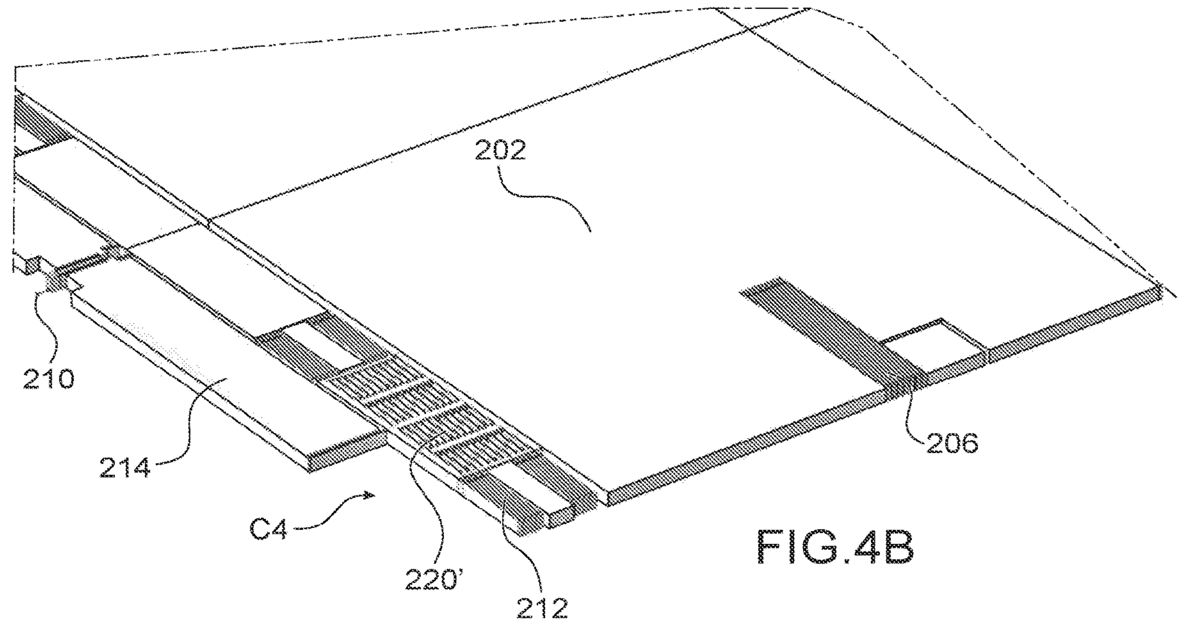
FIGS. 4B, 4C, 4D and 4E are detailed views of the accelerometer of FIG. 4A.
Figure 4C:
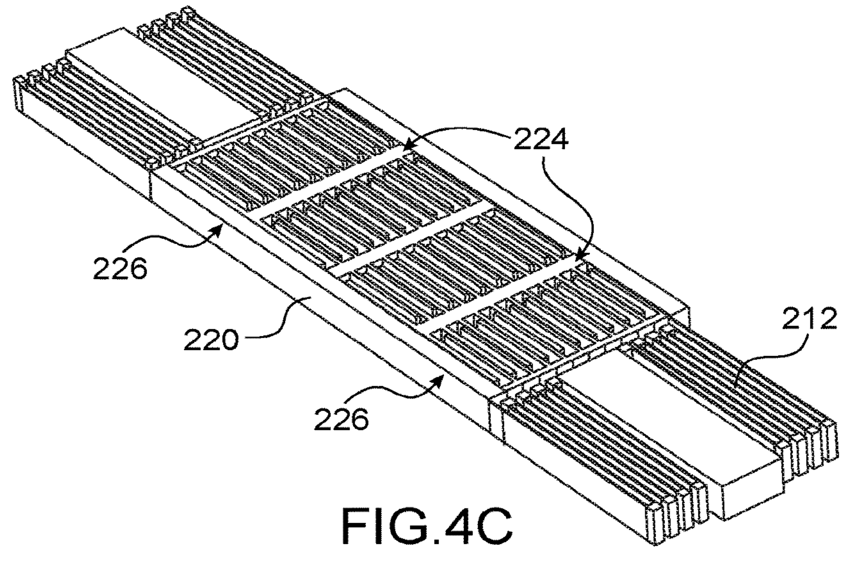

Only the carriage 220 is described in detail; this is shown in particular in FIG. 4C. The carriage 220 includes two pairs of combs 226, cooperating with the combs 224 joined to the mass 204. The combs 224, 226 are oriented so as to exert a force in direction X. The fingers of all the combs are parallel and the combs are interdigitated two-by-two.

The carriage 220 has a very low mass to that of the seismic mass 204, this can be obtained advantageously by integrating combs into the carriages and the relatively hollow structure of the carriages.

Figure 4D:
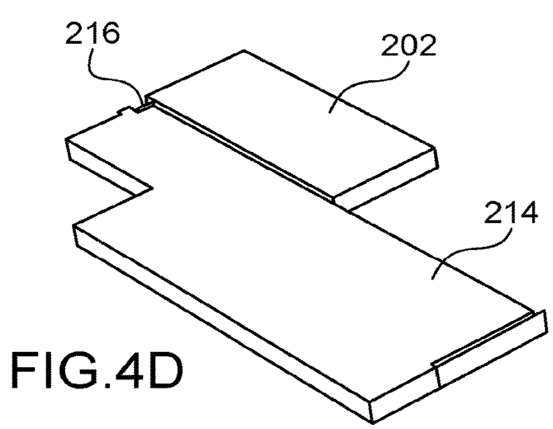

Each carriage 220 is connected to the vibrating beam 210 by a lever arm 214 formed by a beam articulated by rotation to the support 202 by a pivot link 216 (FIG. 4D).

Figure 4E:
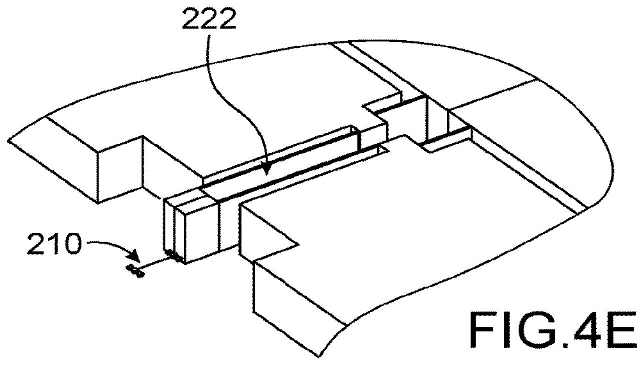

Each carriage 220 is connected to a longitudinal end of the lever arm 214 and the vibrating beam 210 is connected to the other end of the lever arm 214 and the pivot link 216 is located between the two ends. In this example, the vibrating beam 210 is connected to the longitudinal ends opposite the lever arm connected to the carriage 220 and to the lever arm connected to the carriage 220'. The connection is formed in the example shown by a U-shaped transmission 222, each end of the branches of the U being fixed to a longitudinal end of a lever arm, and the vibrating beam 210 and connected to the base of the U (FIG. 4E).

As the lever arm 214, 214' and the carriages are structurally decoupled from the mass, some of the internal stresses of the vibrating beams can be relaxed. Furthermore, by applying a potential different between the seismic mass 204 and the carriages 220, 220', the carriages 220, 220' approach the seismic mass causing the lever arms to rotate and a tensile force to be applied to the vibrating beam 210 via the transmission. This force is preferably such that it cancels out of the other portion of internal stresses or even puts the vibrating beam under stress.

The same phenomenon occurs on the vibrating beam 210' by way of the coupling means C4'.

An accelerometer similar to the ACC4 accelerometer only including a vibrating beam and a carriage does not fall within the scope of the present invention.

The functioning of the ACC4 accelerometer is similar to that of the ACC3 accelerometer.

Figure 5:
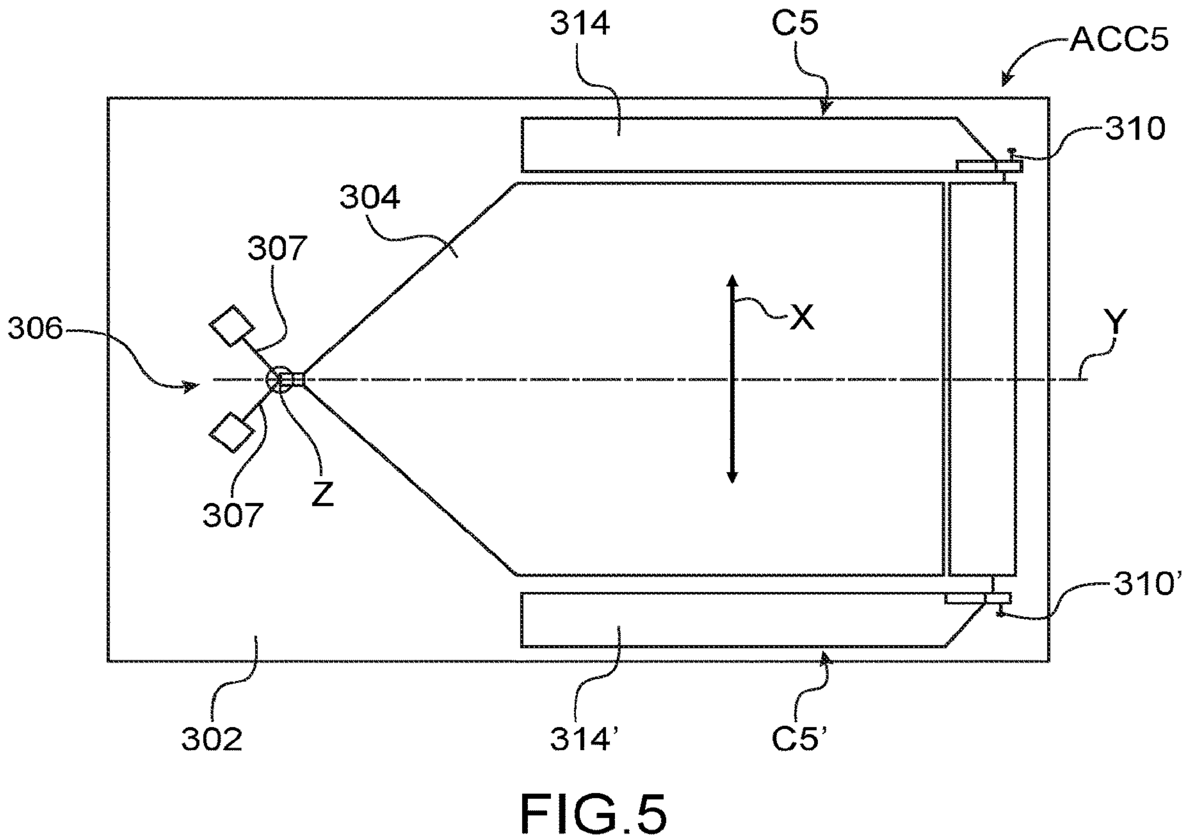
FIG. 5 is a schematic representation of an accelerometer according to the invention according to a third embodiment.

FIG. 5 shows an embodiment of an ACC5 accelerometer according to a third embodiment.

The accelerometer ACC5 differs from the other embodiments in that the seismic mass 304 is mounted so as be rotatable about an axis Z normal to the plane of the accelerometer.

The mass 304 is suspended from the support 302 by a pivot joint 306. In this example, the pivot joint includes two beams 307, each anchored at one end to an anchoring stud of the support and fixed at the other end to the seismic mass 304. The beams 307 connect to the seismic mass 304 at the same point through which the axis of rotation Z passes. In this example the shape of the seismic mass 304 is defined by an assembly of a square and an isosceles triangle, the base of the isosceles triangle coinciding with a side of the square. The beams 307 of the pivot joint connect to the seismic mass 304 at the apex of the isosceles triangle.

The accelerometer also includes measuring means, in the example it has two differential vibrating means 310, 310' and electrostatic coupling means C5, C5'.

The electrostatic coupling means C5, C5' are similar to those of the accelerometers ACC3 and ACC4, they use two lever arms 314, 314' articulated in rotation on the support and coupled electrostatically with the seismic mass 304.

In this example, the coupling is formed directly between a side face of the lever arm 314, 314' and a side of the seismic mass 304. In the example shown, this is a side of the square.

The mass has an axis of symmetry Y intersecting the axis of rotation Z.

The lever arms 314, 314' are arranged symmetrically on either side of the seismic mass with respect to the Y axis. By placing the axis of rotation of the mass and the axes of the rotation of the lever arms on the same side, the facing surfaces of the air gaps remain substantially parallel.

As with the ACC4 accelerometer, the articulation of each lever arm 314, 314' is located between the vibrating beam 310, 310' and the electrostatic coupling area and the vibrating beam 310, 310' is arranged opposite the pivot joint relative to the lever arm. Alternatively, the locations of the pivot joint of each lever arm and that of the resonator can be reversed.

When a potential different is applied between the seismic mass and the lever arms, the lever arms move closer to the seismic mass in direction X, applying a tensile force to the vibrating beams 310, 310', which makes is possible to reduce, or even cancel the internal stresses, which have been partially relaxed by the structure of the accelerometer.

The functioning of the ACC5 accelerometer is similar to that of the accelerometers described above.

The use of a rotatable seismic mass makes it possible advantageously to eliminate any losses associated with the translational guidance of the carriages of the 1/D electrostatic coupling means.

In the examples described above, the interdigitated electrostatic combs are used with a lever arm. It should be noted that a configuration in which the carriage provided with electrostatic combs are interdigital with the ground combs and in which the carriage is connected directly to the resonant beam is not beyond the scope of the present invention.

The accelerometer according to the present invention is particularly suitable for use as a gravimeter.

In gravimetry, an accelerometer is subjected to the acceleration of gravity (1 g) and measures the small displacements of the seismic mass around this point of equilibrium, representing inter alia the fluctuations of the Earth's gravity. To measure such displacements, the accelerometer needs to be very sensitive. There is a gravimeter which uses capacitive detection and means of suspending the seismic mass with infinitely low stiffness, the hinges are configured to buckle when the seismic mass is subjected to 1 g of Earth's acceleration. Such a gravimeter is described in document W. Wu et al., "*Measurement of Tidal Tilt by a Micromechanical Inertial Sensor Employing Quasi-Zero-Stiffness Mechanism,*" *J. MICROELECTROMECHANICAL Syst*., vol. 29, no. 5, p. 10, 2020.

By means of the present invention, it is possible to produce a gravimeter using vibrating beam detection with a nanometric cross-section having increased sensitivity compared to capacitive detection, while not altering the infinitely low stiffness of the suspension means, and thus by way of the implementation of electrostatic coupling means which makes it possible to mechanically decouple the mass of vibrating beams. The use of electrostatic coupling means is even more interesting as the electrostatic force depends on the square of the air gap variation, and therefore the displacement of the seismic mass.

The gravimeter includes an accelerometer according to the invention, having differential measurement means and suspension means whose dimensions have been calculated to buckle when the seismic mass is subjected to 1 g of Earth's acceleration. The buckling takes place in a direction in the plane of the accelerometer, i.e. in the direction of displacement of the mass. The suspension means described in the document W. Wu et al., "*Measurement of Tidal Tilt by a Micromechanical Inertial Sensor Employing Quasi-Zero-Stiffness Mechanism,*" *J. MICROELECTROMECHANICAL Syst*., vol. 29, no. 5, p. 10, 2020 can be implemented.

As already described above, the smallest possible air gap is desirable. However, the manufacturing processes do not allow this width to be reduced below a ratio of 20 to the thickness of the micrometric layer. Thus an air gap with a width of 1 μm can be formed for a micrometric layer of 20 μm. By way of the initial deflection of the mass and the generation of electrostatic force the width of the air gap is reduced at rest.

It should be noted that with the use of an accelerometer according to the invention as a gravimeter, mainly a sensitive sensor and not a sensor with a broad operating range is required.

In another embodiment, the measuring means include at least one piezoresistive gauge, advantageously two differential gauges. By way of the electrostatic coupling means, all or part of the internal stresses are cancelled in the gauges, or even the gauges are energised. All of the examples described above can use one or more piezoresistive gauges instead of the one or more vibrating beams.

The force sensor according to the invention can be used in other applications, for example as a magnetometer using magnetic material or current lines, or a pressure sensor in which the test body is a membrane. All of the examples described above in their application to an accelerometer can be applied to any other force sensor.

It should be noted that the embodiments are not limiting. Other suspension means can be used to guide the masses in translation and other configurations of pivot joints can also be provided.

It is also noted that the electrostatic coupling means including interdigitated combs can be applied to a rotating seismic mass.

In addition, in the embodiments, the vibrating beam(s) or piezoresistive gauge(s) is/are aligned with the direction of displacement of the seismic mass movable in translation, any other orientation is conceivable, for example using return means. In examples using lever arms, the vibrating beams or the piezoresistive gauges can be oriented orthogonally to the hinge beam.

In addition the vibrating beams or the piezoresistive gauges and/or the carriages can be connected to the lever arms at points other than the ends thereof.

The force sensors according to the invention can be produced by microelectronic processes, in particular from MEMS & NEMS technology, which are well known to persons skilled in the art using depositing and etching steps.

The manufacturing processes are such that the vibrating beams or piezoresistive gauges are manufactured in a nanometric layer and the electrostatic coupling means and the seismic mass are manufactured in a stack of nanometric and micrometric layers. The facing surfaces of the electrostatic coupling means are defined in part by the thickness of the coupling means which is micrometric in size.

The invention claimed is:

1. A force sensor comprising:

a support, at least one test body which is suspended by suspension means relative to the support and configured to move in a plane parallel to the support, means for measuring displacement of the at least one test body including at least one first strain gauge provided with a vibrating beam, and first electrostatic coupling means between the test body and the at least one first strain gauge configured to provide mechanical decoupling between said first strain gauge and the test body, wherein at rest the first electrostatic coupling means generates traction on the first strain gauge and, under an effect of an external force, a state of strain of the first strain gauge is modified, wherein the vibrating beam has a nanometric cross-section, between several tens of nanometers and 1 μm, the vibrating beam is suspended at one end from the support and at another end from a suspension beam, the suspension beam has a cross-section at least ten times greater than a cross-section of the vibrating beam, and the suspension beam has a micrometric cross-section of between 1 μm and several hundred hundreds of micrometers.

2. The force sensor according to claim 1, comprising a second strain gauge of nanometric cross-section with increased differential relative to the first strain gauge, and second electrostatic coupling means between the test body and the second strain gauge configured to ensure mechanical decoupling between the second strain gauge and the test body, wherein at rest the second electrostatic coupling means generates traction on the second strain gauge and, under an effect of acceleration, a state of strain of the second strain gauge is modified.

3. The force sensor according to claim 2, wherein the first and/or second electrostatic coupling means are configured to generate at rest an electrostatic force so as to at least cancel residual strains in the first strain gauge and/or the second strain gauge.

4. The force sensor according to claim 2, wherein the suspension beam forms a lever arm and is rotatably articulated in a plane of the sensor, the lever arm being electrostatically coupled with the test body, the sensor further comprising a pivot joint by which the test body is suspended from the support and by which the test body is rotatable in the plane of the force sensor, wherein the first and/or the second coupling means are formed by a side face of the suspension beam forming the lever arm and a edge facing the test body.

5. The force sensor according to claim 1, wherein the first electrostatic coupling means comprises the suspension beam, whereby electrostatic coupling is achieved between the suspension beam and the test body.

6. The force sensor according to claim 1, wherein the first electrostatic coupling means comprises at least a first electrode and a second electrode, the first electrode being formed by a side of the test body and the second electrode being formed by a side face of said suspension beam attached to a longitudinal end of the vibrating beam.

7. The force sensor according to claim 1, wherein the suspension beam forms a lever arm and is rotatably articulated in a plane of the sensor, the lever arm being electrostatically coupled with the test body.

8. The force sensor according to claim 1, wherein the first electrostatic coupling means each includes at least one pair of interdigitated combs with fingers, a first comb of the at least one pair being integral with movement with the test body and a second comb of the at least one pair being fixed to a lever arm formed by the suspension beam.

9. The force sensor according to claim 1, wherein the test body and the suspension means of the test body are configured so that the test body is moved in translation in the plane in a given direction.

10. The force sensor according to claim 1, wherein the first electrostatic coupling means include at least one carriage bearing at least one comb and connected mechanically to a lever arm formed by the suspension beam.

11. The force sensor according to claim 10, wherein the at least one carriage has a reduced mass compared with that of the test body, the mass of the at least one carriage being at least 10 times less than the mass of the test body.

12. The force sensor according to claim 10, wherein the at least one carriage includes an outer frame delimited by uprights from which fingers of the at least one comb project, and wherein the at least one comb integral with the movement with the test body is arranged inside the outer frame and the fingers of the at least one comb are placed between comb fingers of the carriage.

13. The force sensor according to claim 10, further comprising a plurality of pairs of interdigitated combs so as to provide a large electrostatic coupling surface.

14. An accelerometer including a force sensor according to claim 1, wherein the test body is a seismic mass.

15. A gravimeter including at least one accelerometer according to claim 14, wherein the suspension means of the seismic mass is configured to buckle when the seismic mass is subjected to 1 g of the Earth's acceleration.

* * * * *